United States Patent
Lee et al.

(10) Patent No.: US 10,425,113 B2
(45) Date of Patent: Sep. 24, 2019

(54) MULTIBAND RADIO FREQUENCY TRANSMITTER WITH RECEIVING BAND VARIABLE FILTERING FUNCTION

(71) Applicant: SAMSUNG ELECTRO-MECHANICS CO., LTD., Suwon-si (KR)

(72) Inventors: Geun Yong Lee, Suwon-si (KR); Jong Soo Lee, Suwon-si (KR); Tae Ho Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 11 days.

(21) Appl. No.: 15/800,637

(22) Filed: Nov. 1, 2017

(65) Prior Publication Data

US 2018/0337699 A1    Nov. 22, 2018

(30) Foreign Application Priority Data

May 16, 2017  (KR) .................. 10-2017-0060687

(51) Int. Cl.
*H04B 1/04*  (2006.01)
*H04B 1/00*  (2006.01)
*H03H 7/01*  (2006.01)
*H03H 7/38*  (2006.01)

(52) U.S. Cl.
CPC ......... *H04B 1/0475* (2013.01); *H04B 1/0053* (2013.01); *H03H 7/0115* (2013.01);
(Continued)

(58) Field of Classification Search
CPC ................ H04B 1/0475; H04B 1/0053; H04B 2001/0408; H03H 7/0115; H03H 7/38;
(Continued)

(56) References Cited

U.S. PATENT DOCUMENTS 6,489,862 B1    12/2002  Frank
7,586,389 B2 *   9/2009  Ali-Ahmad .............. H03H 9/54
                                                      333/133
(Continued)

FOREIGN PATENT DOCUMENTS

JP    2013-219724 A     10/2013
KR    2002-0026836 A     4/2002
KR    10-1599782 B1      3/2016

OTHER PUBLICATIONS

Hidenori Obiya, et al., "A Study on Low Rx-Band Noise Power Amplifier for Reconfigurable RF Front-End Circuit," *Proceedings of Microwave Symposium (IMS)*, 2015 IEEE MTT-S International, May 2015 (3 pages in English).

*Primary Examiner* — Pablo N Tran
(74) *Attorney, Agent, or Firm* — NSIP Law

(57) ABSTRACT

A multiband radio frequency transmitter of a transceiver in which a receiving band is varied, includes a transmitting circuit, a receiving band-rejection filter, a power amplifying circuit, and an impedance compensating circuit. The transmitting circuit is configured to generate a transmission signal. The receiving band-rejection filter is configured to vary a rejection band in response to a variation of the receiving band, and reject the receiving band from the transmission signal provided from the transmitting circuit. The power amplifying circuit is configured to amplify the transmission signal that passes through the receiving band-rejection filter. The impedance compensating circuit is configured to compensate for impedance mismatch due to the variation of the rejection band of the receiving band-rejection filter.

20 Claims, 7 Drawing Sheets

(52) U.S. Cl.
CPC ......... *H03H 7/1758* (2013.01); *H03H 7/1766* (2013.01); *H03H 7/38* (2013.01); *H03H 2007/013* (2013.01); *H03H 2210/012* (2013.01); *H03H 2210/025* (2013.01); *H04B 2001/0408* (2013.01)

(58) Field of Classification Search
CPC .... H03H 2007/013; H03H 9/54; H03H 9/706; H03H 9/70; H03H 3/02
See application file for complete search history.

(56) References Cited

U.S. PATENT DOCUMENTS

| | | | | |
|---|---|---|---|---|
| 8,258,876 | B1* | 9/2012 | Osika | H03F 3/245 |
| | | | | 330/279 |
| 9,041,484 | B2* | 5/2015 | Burgener | H03H 9/54 |
| | | | | 333/101 |
| 9,148,112 | B2* | 9/2015 | Wan | H03H 7/38 |
| 9,306,511 | B2* | 4/2016 | Chow | H03F 3/193 |
| 9,882,538 | B2* | 1/2018 | Poulin | H03F 3/245 |
| 2008/0119214 | A1* | 5/2008 | Liu | H03H 7/38 |
| | | | | 455/522 |
| 2012/0007666 | A1* | 1/2012 | David | H03H 9/02031 |
| | | | | 327/552 |
| 2015/0084718 | A1* | 3/2015 | Maxim | H01F 17/0013 |
| | | | | 333/174 |
| 2016/0099699 | A1* | 4/2016 | Bakalski | H04B 1/0458 |
| | | | | 333/33 |
| 2016/0285425 | A1* | 9/2016 | Poulin | H03F 3/195 |
| 2016/0285482 | A1* | 9/2016 | Wada | H04B 1/0458 |
| 2017/0244376 | A1* | 8/2017 | Morris | H03H 7/0153 |

* cited by examiner

MULTIBAND RADIO FREQUENCY TRANSMITTER WITH RECEIVING BAND VARIABLE FILTERING FUNCTION

CROSS-REFERENCE TO RELATED APPLICATION(S)

This application claims benefit under 35 USC 119(a) of Korean Patent Application No. 10-2017-0060687 filed on May 16, 2017 in the Korean Intellectual Property Office, the entire disclosure of which is incorporated herein by reference for all purposes.

BACKGROUND

1. Field

The following description relates to a multiband radio frequency transmitter with a receiving band variable filtering function that may remove receiving (Rx) band noise in response to a variation in a receiving band and compensate for impedance mismatch, in a multiband radio frequency transceiver in frequency division duplexing (FDD) communications.

2. Description of Related Art

In general, a communications device utilizing a communications scheme such as long term evolution (LTE), wideband code division multiple access (WCDMA), global system for mobile communication (GSM), or the like may use a FDD or time division duplexing (TDD) method to perform both uplink and downlink communications. FDD refers to a method of simultaneously performing full duplex communications by offsetting a receiving frequency and a transmitting frequency from each other, and TDD refers to a method of performing communications by dividing the time to cross a receiving mode and a transmitting mode based on a time axis.

In the FDD, the transmitting frequency and the receiving frequency are offset from each other to significantly reduce mutual interference. However, since the receiving path very sensitive, a transmitting signal having high power interferes with the receiving band, which has an adverse effect as receiving (Rx) band noise. Since the receiving band noise directly affects reception sensitivity, it is managed as an important performance index in transmission.

In addition, the FDD communications device offsets the transmitting band and the receiving band from each other using a duplexer. However, isolation provided by the duplexer is limited due to a number of reasons, one of which is that isolation has an inverse relationship with transmission insertion loss and harmonic characteristics. For example, if transmission insertion loss is improved in the duplexer, isolation becomes worse, and conversely, if isolation is improved, transmission insertion loss becomes worse.

Therefore, it is difficult to satisfy the isolation requirement above a required level while maintaining the transmission insertion loss above a required level using a conventional duplexer.

Since transmission insertion loss characteristics in the multiband radio frequency transceiver in the FDD communications are related to relatively long distance communications and efficiency, they are considered to be important.

A conventional multiband transceiver of FDD communications uses filters like an RC low pass filter, an LC low pass filter, an LC trap, and the like, to block supply noise introduced from an operation supply VCC, as a method for reducing the receiving band noise.

However, such a conventional method for removing supply noise may not efficiently remove the receiving band noise. In addition, the duplexer may remove the receiving band noise to the required level, but in this case, since the transmission insertion loss of the duplexer may become worse, there is a need for a method that may improve isolation characteristics while maintaining the transmission insertion loss above the required level.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multiband radio frequency transmitter of a transceiver in which a receiving band is varied, includes a transmitting circuit, a receiving band-rejection filter, a power amplifying circuit, and an impedance compensating circuit. The transmitting circuit is configured to generate a transmission signal. The receiving band-rejection filter is configured to vary a rejection band in response to a variation of the receiving band, and reject the receiving band from the transmission signal provided from the transmitting circuit. The power amplifying circuit is configured to amplify the transmission signal that passes through the receiving band-rejection filter. The impedance compensating circuit is configured to compensate for impedance mismatch due to the variation of the rejection band of the receiving band-rejection filter.

The impedance compensating circuit may include a first impedance compensating circuit and a second impedance compensating circuit. The first impedance compensating circuit may be disposed between the transmitting circuit and the receiving band-rejection filer, and configured to compensate for mismatch of output impedance of the transmitting circuit in response to the variation of the rejection band of the receiving band-rejection filter. The second impedance compensating circuit may be disposed between the receiving band-rejection filter and the power amplifying circuit, and configured to compensate for mismatch of input impedance of the power amplifying circuit in response to the variation of the rejection band of the receiving band-rejection filter.

The receiving band-rejection filter may include an inductor circuit and a capacitor circuit. The inductor circuit may be inserted into a signal wiring between the transmitting circuit and the power amplifying circuit. The capacitor circuit may be connected in parallel to the inductor circuit to perform a parallel resonance with inductance of the inductor circuit, and have capacitance varied in response to a first control signal to vary the rejection band in response to the variation of the receiving band.

The inductor circuit may include a bonding wire.

The first impedance compensating circuit may include a first variable capacitor circuit having capacitance varied in response to a second control signal to compensate for the mismatch of the output impedance of the transmitting circuit due to the variation of the rejection band of the receiving band-rejection filter.

The second impedance compensating circuit may include a second variable capacitor circuit having capacitance varied in response to a third control signal to compensate for the mismatch of the input impedance of the power amplifying circuit due to the variation of the rejection band of the receiving band-rejection filter.

The receiving band-rejection filter may include an inductor circuit and a capacitor circuit that are connected between a connection node between the transmitting circuit and the power amplifying circuit, and a ground, and configured to perform series resonance in the receiving band. The capacitor circuit may have capacitance varied in response to a first control signal to vary the rejection band in response to the variation of the receiving band.

In another general aspect, a multiband radio frequency transmitter of a transceiver in which a receiving band is varied, includes a transmitting circuit, a receiving band-rejection filter, a power amplifying circuit, an impedance compensating circuit, and a control circuit. The transmitting circuit is configured to generate a transmission signal. The receiving band-rejection filter is configured to vary a rejection band in response to a variation of the receiving band, and reject the receiving band from the transmission signal provided from the transmitting circuit. The power amplifying circuit is configured to amplify the transmission signal that passes through the receiving band-rejection filter. The impedance compensating circuit is configured to compensate for impedance mismatch due to the variation of the rejection band of the receiving band-rejection filter. The control circuit is configured to control the variation of the rejection band of the receiving band-rejection filter and a variation of impedance of the impedance compensating circuit at the time of varying the receiving band.

The impedance compensating circuit may include a first impedance compensating circuit and a second impedance compensating circuit. The first impedance compensating circuit may be disposed between the transmitting circuit and the receiving band-rejection filer, and configured to compensate for mismatch of output impedance of the transmitting circuit in response to the variation of the rejection band of the receiving band-rejection filter. The second impedance compensating circuit may be disposed between the receiving band-rejection filter and the power amplifying circuit, and configured to compensate for mismatch of input impedance of the power amplifying circuit in response to the variation of the rejection band of the receiving band-rejection filter.

The receiving band-rejection filter may include an inductor circuit and a capacitor circuit. The inductor circuit may be inserted into a signal wiring between the transmitting circuit and the power amplifying circuit. The capacitor circuit may be connected in parallel to the inductor circuit to perform a parallel resonance with inductance of the inductor circuit, and having capacitance varied in response to a first control signal of the control circuit to vary the rejection band in response to the variation of the receiving band.

The inductor circuit may include a bonding wire.

The first impedance compensating circuit may include a first variable capacitor circuit having capacitance varied in response to a second control signal to compensate for the mismatch of the output impedance of the transmitting circuit due to the variation of the rejection band of the receiving band-rejection filter.

The second impedance compensating circuit may include a second variable capacitor circuit varying capacitance varied in response to a third control signal of the control circuit to compensate for the mismatch of the input impedance of the power amplifying circuit in response to the variation of the rejection band of the receiving band-rejection filter.

The receiving band-rejection filter may include an inductor circuit and a capacitor circuit that are connected between a connection node between the transmitting circuit and the power amplifying circuit, and a ground, and configured to perform series resonance in the receiving band. The capacitor circuit may have capacitance varied in response to a first control signal of the control circuit to vary the rejection band in response to the variation of the receiving band.

The receiving band-rejection filter may be implemented in an integrated circuit together with the control circuit.

Other features and aspects will be apparent from the following detailed description, the drawings, and the claims

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
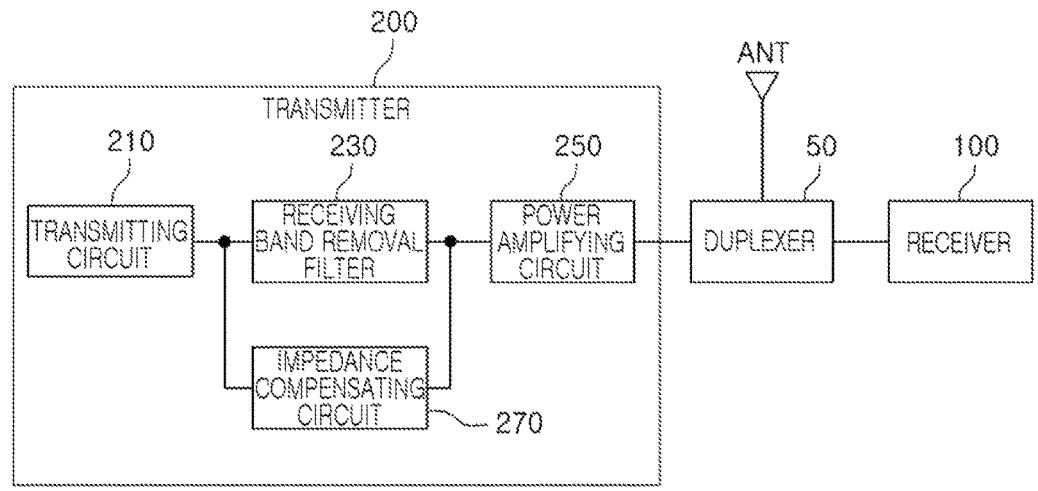
FIG. 1 is an illustrative diagram of an example of a multiband radio frequency transceiver.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is an illustrative diagram of an example of a multiband radio frequency transceiver in the present disclosure.

Referring to FIG. 1, a multiband radio frequency transceiver in the present disclosure is a frequency division duplexing (FDD) communications device that transmits/receives a multiband, and includes a duplexer 50, a receiver 100, and a transmitter 200 that are connected to an antenna ANT.

The multiband radio frequency transceiver changes a communications band, and the transmitting band (TX Band) and the receiving band (RX Band) are varied accordingly.

The transmitter 200 includes a transmitting circuit 210, a receiving band-rejection filter 230, a power amplifying circuit 250, and an impedance compensating circuit 270.

The transmitting circuit 210 generates a transmission (TX) signal. As an example, the transmitting circuit 210, which is a circuit for generating the transmission signal based on transmission data, may include a modulator, a D/A converter, a mixer, an amplifier, and the like.

The receiving band-rejection filter 230 varies a rejection band in response to a variation of the receiving band, and removes the receiving band (RX Band) from the transmission signal provided from the transmitting circuit 210. The receiving band-rejection filter 230 may be a band-stop filter or a notch filter.

The power amplifying circuit 250 amplifies the transmission signal that passes through the receiving band-rejection filter 230.

The impedance compensating circuit 270 compensates for impedance mismatch due to the variation of the rejection band by the receiving band-rejection filter 230.

Figure 2:
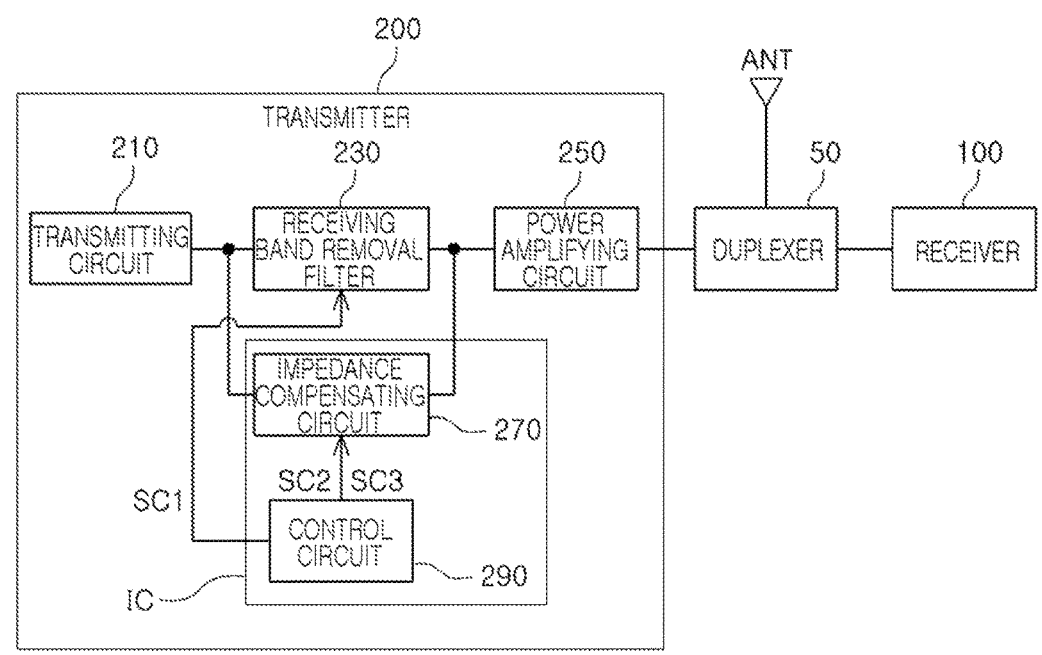
FIG. 2 is another illustrative diagram of an example of the multiband radio frequency transceiver.

FIG. 2 is another illustrative diagram of an example of the multiband radio frequency transceiver in the present disclosure.

Referring to FIG. 2, the transmitter 200 includes the transmitting circuit 210, the receiving band-rejection filter 230, the power amplifying circuit 250, the impedance compensating circuit 270, and a control circuit 290.

The transmitting circuit 210 generates a transmission (TX) signal. As an example, the transmitting circuit 210, which is a circuit for generating the transmission signal based on transmission data, may include a modulator, a D/A converter, a mixer, an amplifier, and the like.

The receiving band-rejection filter 230 varies a rejection band in response to a variation of the receiving band, and removes the receiving band (RX Band) from the transmission signal provided from the transmitting circuit 210.

The power amplifying circuit 250 amplifies the transmission signal that passes through the receiving band-rejection filter 230.

The impedance compensating circuit 270 compensates for impedance mismatch due to the variation of the rejection band of the receiving band-rejection filter 230.

At the time when the receiving band is varied, the control circuit 290 controls the variation of a rejection band of the receiving band-rejection filter 230 and the variation of impedance of the impedance compensating circuit 270.

As an example, the control circuit 290 provides a first control signal SC1 to the receiving band-rejection filter 230 to perform the variation of the rejection band of the receiving band-rejection filter 230 at the time of varying the receiving band, and provides second and third control signals SC2 and SC3 to the impedance compensating circuit 270 to vary the impedance of the impedance compensating circuit 270.

The receiving band-rejection filter 230 may be implemented in one integrated circuit together with the control circuit 290.

Circuits, components, or control lines for implementing the receiving band-rejection filter 230 may not be added to a printed circuit board (PCB) of the transceiver, and the receiving band-rejection filter 230 may be connected to an radio frequency (RF) input path to attenuate noise such as receiving band noise, or the like included in an input signal, thereby reducing overall noise.

The control signal 290 includes control signals that correspond to each of a plurality of receiving bands of a multiband. Accordingly, when the receiving band is selected or changed, the control circuit 290 provides the corresponding control signal for the removal of the receiving band noise and the impedance compensation in response to the selection or the change of the receiving band.

Figure 3:
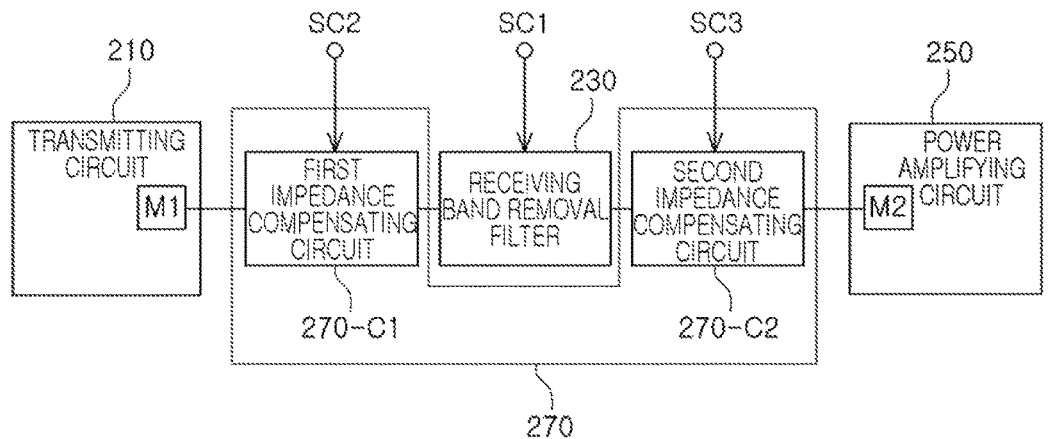
FIG. 3 is an illustrative diagram of an example of an impedance compensating circuit.

FIG. 3 is an illustrative diagram of an example of an impedance compensating circuit in the present disclosure.

Referring to FIG. 3, the impedance compensating circuit 270 includes a first impedance compensating circuit 270-C1 and a second impedance compensating circuit 279-C2.

In addition, the transmitting circuit 210 includes a first matching circuit M1 for impedance matching of an output terminal of the transmitting circuit 210, and the power amplifying circuit 250 includes a second matching circuit M2 for impedance matching of an input terminal of the power amplifying circuit 250.

As an example, in a case in which a band to be removed by the receiving band-rejection filter 230 is varied, since preset impedance is deviated, each of the first matching circuit M1 and the second matching circuit M2 needs to be compensated for impedance matching. Such an impedance compensation is performed by the first impedance compensating circuit 270-C1 and the second impedance compensating circuit 270-C2.

The first impedance compensating circuit 270-C1 is disposed between the transmitting circuit 210 and the receiving band-rejection filter 230 to compensate for mismatch of output impedance of the transmitting circuit 210 in response to the variation of the rejection band of the receiving band-rejection filter 230.

As an example, the first impedance compensating circuit 270-C1 varies impedance in response to the second control signal SC2 of the control circuit 290 to compensate for the mismatch of the output impedance of the transmitting circuit 210.

The second impedance compensating circuit 270-C2 is disposed between the receiving band-rejection filter 230 and the power amplifying circuit 250 to compensate for mismatch of input impedance of the power amplifying circuit 250 in response to the variation of the rejection band of the receiving band-rejection filter 230.

As an example, the second impedance compensating circuit 270-C2 varies impedance in response to the third control signal SC3 of the control circuit 290 to compensate for the mismatch of the input impedance of the power amplifying circuit 250.

As described above, the impedance compensating circuit 270 adjusts capacitance in response to the first, second, and third control signals SC1, SC2, and SC3 of the control circuit 290. The resonance point for removing the noise of the receiving band is moved to a corresponding frequency band in response to the variation of the receiving band (see FIG. 8).

In an example, the impedance compensating circuit 270 is an adaptive impedance compensation circuit that automatically changes the capacitance in response to the first, second, and third control signals SC1, SC2, and SC3 of the control circuit 290 in order to maintain maximum wireless power transfer efficiency.

Figure 4:
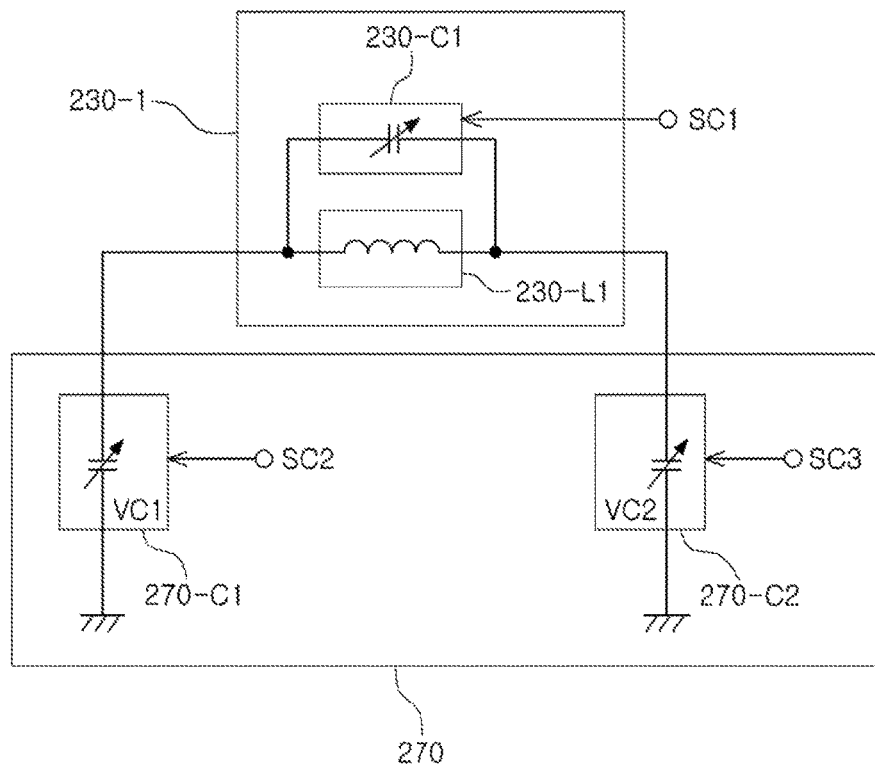
FIG. 4 is an illustrative view of an example of a receiving band-rejection filter.
Figure 5:
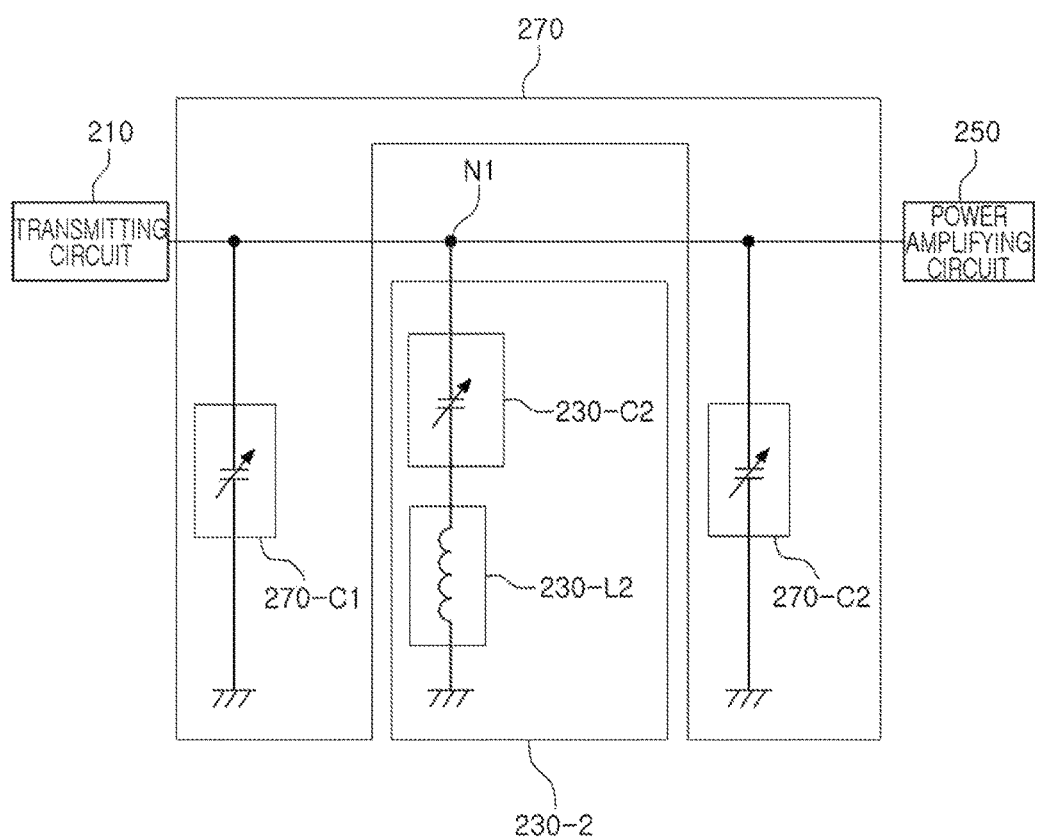
FIG. 5 is another illustrative view of an example of the receiving band-rejection filter.

FIG. 4 is an illustrative view of an example of a receiving band-rejection filter in the present disclosure and FIG. 5 is another illustrative view of an example of the receiving band-rejection filter.

Referring to FIG. 4, a receiving band-rejection filter 230-1 includes an inductor circuit 230-L1 and a capacitor circuit 230-C1 that are connected in parallel to each other.

The inductor circuit 230-L1 is inserted into a signal wiring between the transmitting circuit 210 and the power amplifying circuit 250, and includes inductance for a parallel resonance with capacitance of the capacitance circuit 230-C1.

As an example, the inductor circuit 230-L1 may include a bonding wire. As such, in a case in which the bonding wire that connects the power amplifier and a board (e.g., a printed circuit board (PCB)) to each other is used as the inductor circuit 230-L1, since an additional inductor element is not required, the bonding wire also contributes to an area reduction.

The capacitance circuit 230-C1 is connected in parallel to the inductor circuit 230-L1 to perform the parallel resonance with the inductance of the inductor circuit 230-L1. In response to the variation of the receiving band, the capacitance circuit 230-C1 has capacitance varied in response to the first control signal of the control circuit 290 for varying the rejection band.

In a case in which the receiving band-rejection filter 230-1 is a parallel LC resonance filter, the parallel resonance is formed in the receiving band to form almost an infinite impedance of the receiving band, and an input to the power amplifying circuit in the receiving band is blocked by the receiving band-rejection filter 230-1.

As an example, the first impedance compensating circuit 270-C1 includes a first variable capacitor circuit VC1.

The first variable capacitor circuit VC1 has capacitance varied in response to the second control signal SC2 so as to compensate for the mismatch of output impedance of the transmitting circuit 210 due to the variation of the rejection band of the receiving band-rejection filter 230-1.

As an example, the second impedance compensating circuit 270-C2 includes a second variable capacitor circuit VC2.

The second variable capacitor circuit VC2 has capacitance varied in response to the third control signal SC3 so as to compensate for the mismatch of input impedance of the power amplifying circuit 250 due to the variation of the rejection band of the receiving band-rejection filter 230-1.

Referring to FIG. 5, a receiving band-rejection filter 230-2 includes an inductor circuit 230-L2 and a capacitor circuit 230-C2 that are connected in series with each other.

The inductor circuit 230-L2 and the capacitor circuit 230-C2 are connected in series between a connection node N1 between the transmitting circuit 210 and the power amplifying circuit 250, and a ground, and resonates in series to remove the receiving band.

In addition, the capacitance circuit 230-C2 has capacitance varied in response to the first signal SC1 of the control circuit 290 for varying the rejection band, in response to the variation of the receiving band.

In a case in which the receiving band-rejection filter 230-2 is a series LC resonance filter, the series resonance is formed in the receiving band to form impedance of the receiving band of almost zero, and the receiving band is bypassed to the ground by the receiving band-rejection filter 2330-2 to block an input to the power amplifying circuit may be blocked.

Figure 6:
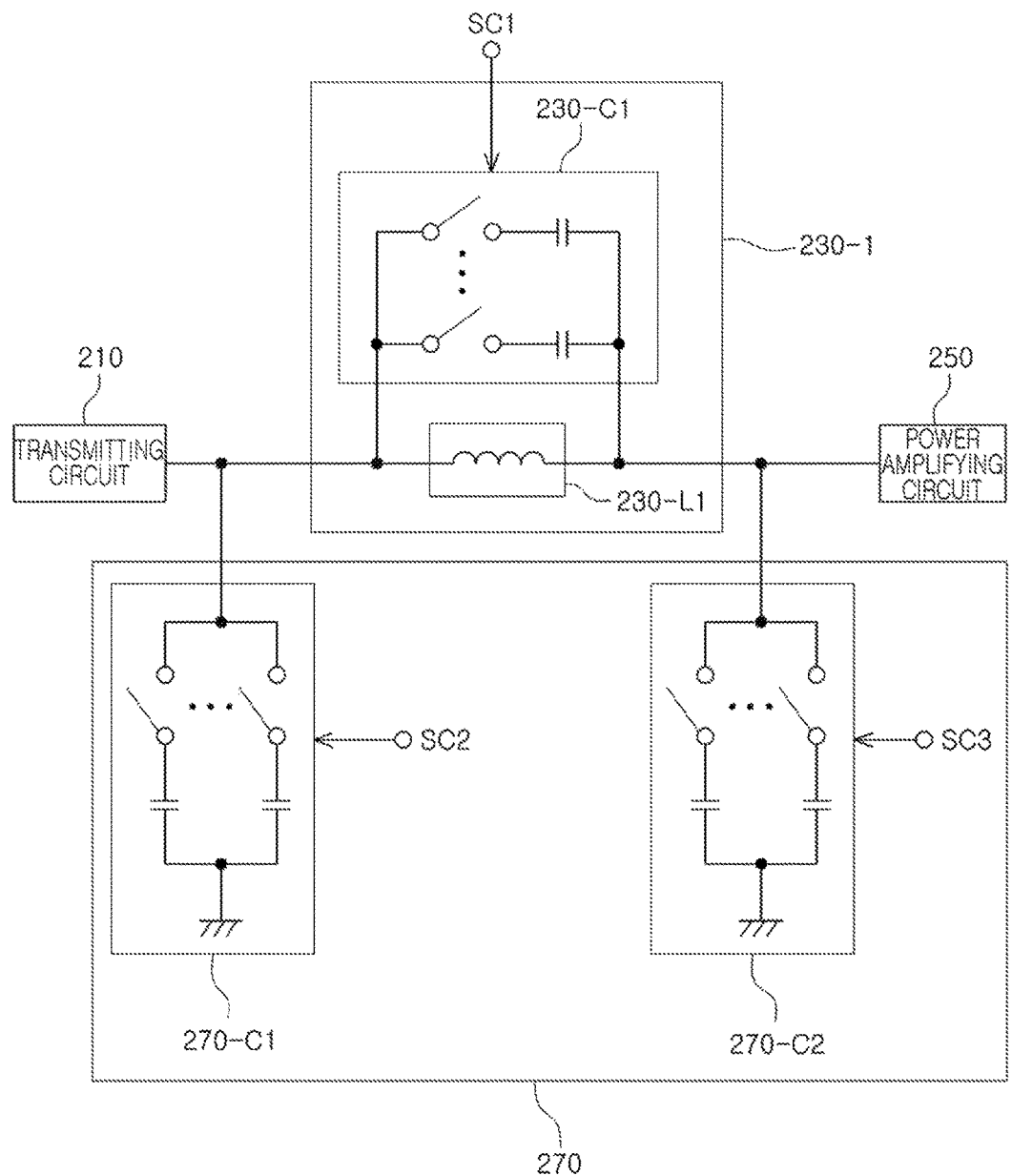
FIG. 6 is an illustrative implementation view of the receiving band-rejection filter of FIG. 4.
Figure 7:
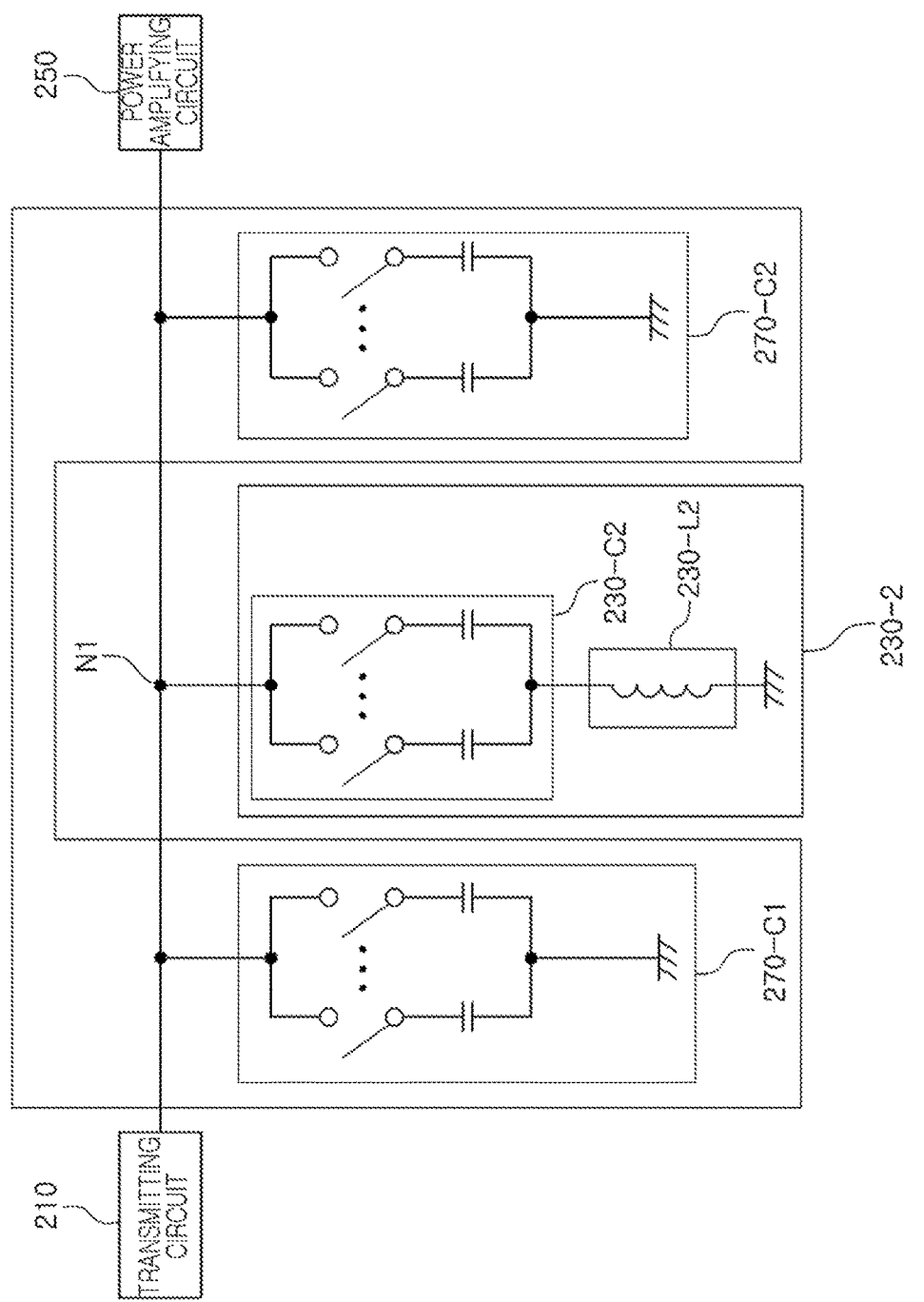
FIG. 7 is an illustrative implementation view of the receiving band-rejection filter of FIG. 5.

FIG. 6 is an illustrative implementation view of the receiving band-rejection filter of FIG. 4 and FIG. 7 is an illustrative implementation view of the receiving band-rejection filter of FIG. 5.

Referring to FIGS. 4 and 6, the capacitor circuit 230-C1 includes a plurality of switched capacitor circuits that are connected in parallel to each other, and each of the plurality of switched capacitor circuits includes a switch and a capacitor that are connected in series with each other.

Referring to FIGS. 5 and 7, the capacitor circuit 230-C2 includes a plurality of switched capacitor circuits that are connected in parallel to each other, and each of the plurality of switched capacitor circuits includes a switch and a capacitor that are connected in series with each other.

Referring to FIGS. 6 and 7, the first impedance compensating circuit 270-C1 includes a plurality of switched capacitor circuits that are connected in parallel to each other, and each of the plurality of switched capacitor circuits includes a switch and a capacitor that are connected in series with each other.

In addition, the second impedance compensating circuit 270-C2 includes a plurality of switched capacitor circuits that are connected in parallel to each other, and each of the plurality of switched capacitor circuits may include a switch and a capacitor that are connected in series with each other.

The respective examples in the present disclosure described above describe the case in which the impedance compensating circuit varies the capacitance, but the present disclosure is not limited thereto. The respective examples may also include a concept of varying the inductance by the receiving band-rejection filter and the impedance compensating circuit. As an example, the circuit that varies the inductance may include a switch and an inductor.

Figure 8:
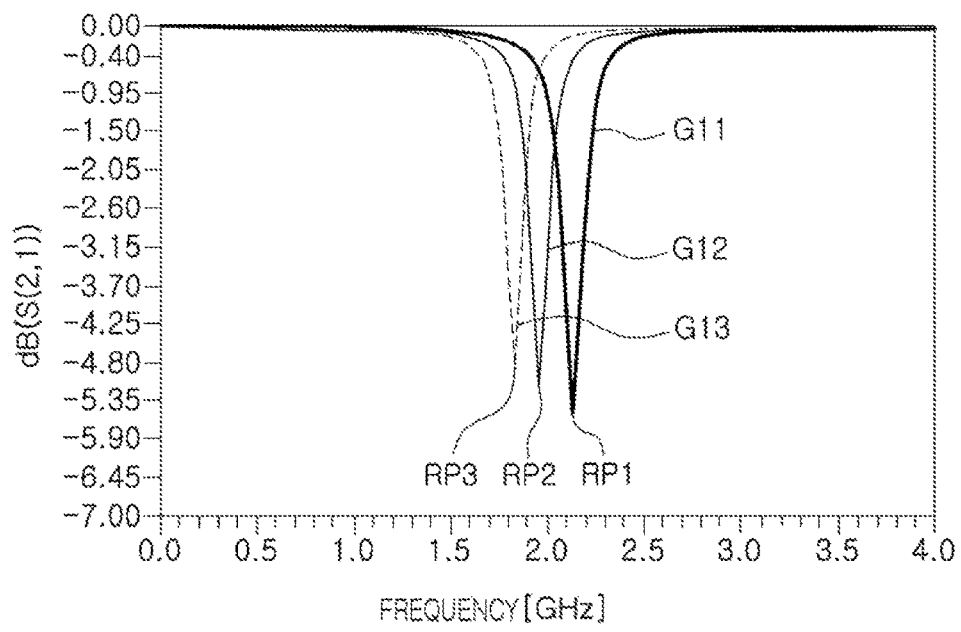
FIG. 8 is a graph illustrating an example of variable characteristics of resonance points (notch points) of the receiving band-rejection filter.

FIG. 8 is a graph illustrating an example of variable characteristics of resonance points (notch points) of the receiving band-rejection filter according to an example in the present disclosure.

In FIG. 8, G11 is a graph illustrating a first resonance point RP1 for a case in which the receiving band-rejection filters 230, 230-1, and 230-2 form resonance points in a receiving band (B1 Rx: 2110 to 2170 MHz) of a band B1, G12 is a graph illustrating a second resonance point RP2 for a case in which the receiving band-rejection filters 230, 230-1, and 230-2 form the resonance points in a receiving band (B2 Rx: 1930 to 1990 MHz) of a band B2, and G13 is a graph illustrating a third resonance point RP3 for a case in which the receiving band-rejection filters 230, 230-1, and 230-2 form the resonance points in a receiving band (B3 Rx: 1805 to 1880 MHz) of a band B3.

Referring to the first, second, and third resonance points RP1, RP2, and RP3 of FIG. 8, the receiving band-rejection filters 230, 230-1, and 230-2 vary the resonance points in response to the variation of the capacitance. Accordingly, even in a case in which the receiving band is varied, since the first, second, and third resonance points RP1, RP2, and RP3 are varied in response to the variation of the receiving band, it is seen that noise of the receiving band may be efficiently removed.

Figure 9:
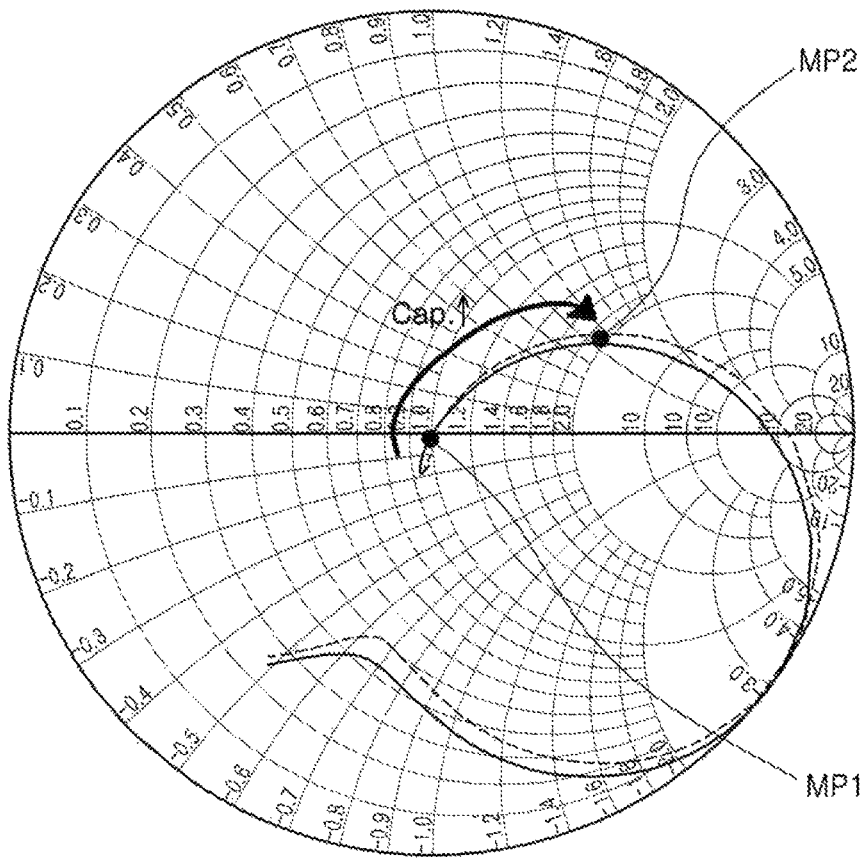
FIG. 9 is a Smith chart illustrating an example of a mismatch of impedance at the time of varying the resonance points of the receiving band-rejection filter.
Figure 10:
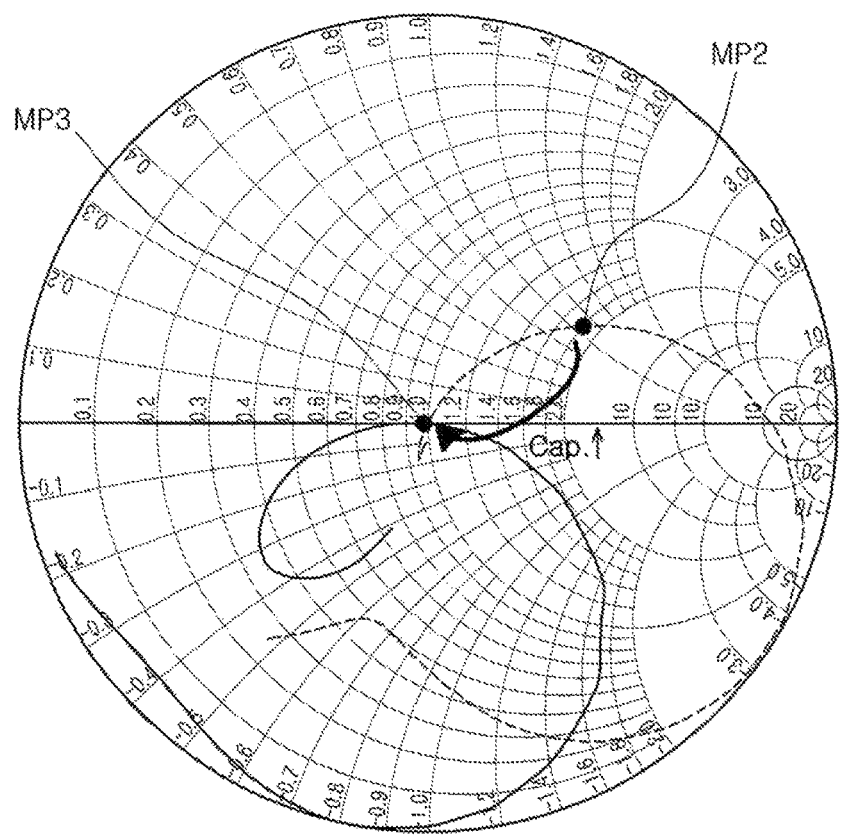
FIG. 10 is a Smith chart illustrating an example of impedance compensation by an impedance compensating circuit.

FIG. 9 is a Smith chart illustrating an example of a mismatch of impedance at the time of varying the resonance points of the receiving band-rejection filter according to an example in the present disclosure and FIG. 10 is a Smith chart illustrating an example of impedance compensation by an impedance compensating circuit according to an example in the present disclosure.

In FIG. 9, MP1 is an impedance point at which a matching is performed, and MP2 is an impedance point appearing at the time of changing the resonance point of the receiving band-rejection filter at the time of changing the receiving band. Referring to the MP1 and MP2, it is shown that the impedance is accurately matched before the change of the receiving band, but the impedance is mismatched after the change of the receiving band.

As such, in a case in which the rejection band is varied by the receiving band-rejection filter to remove the noise of the receiving band corresponding to the varied receiving band, impedance mismatch may be caused. Accordingly, since the impedance mismatch of a transmission band is system loss, this impedance mismatch may be a cause of a decrease of a power gain and efficiency.

In FIG. 10, MP2 is an impedance point of a case in which the impedance matching is deviated in response to the change of the receiving band, and MP3 is an impedance point at which the impedance which deviates from target impedance is again compensated to the target impedance by the impedance compensating circuit. Referring to the MP2 and MP3, it may be seen that the impedance may be mismatched after the change of the receiving band, but the impedance may be again compensated by the impedance compensating circuit to again accurately perform the impedance matching.

Figure 11:
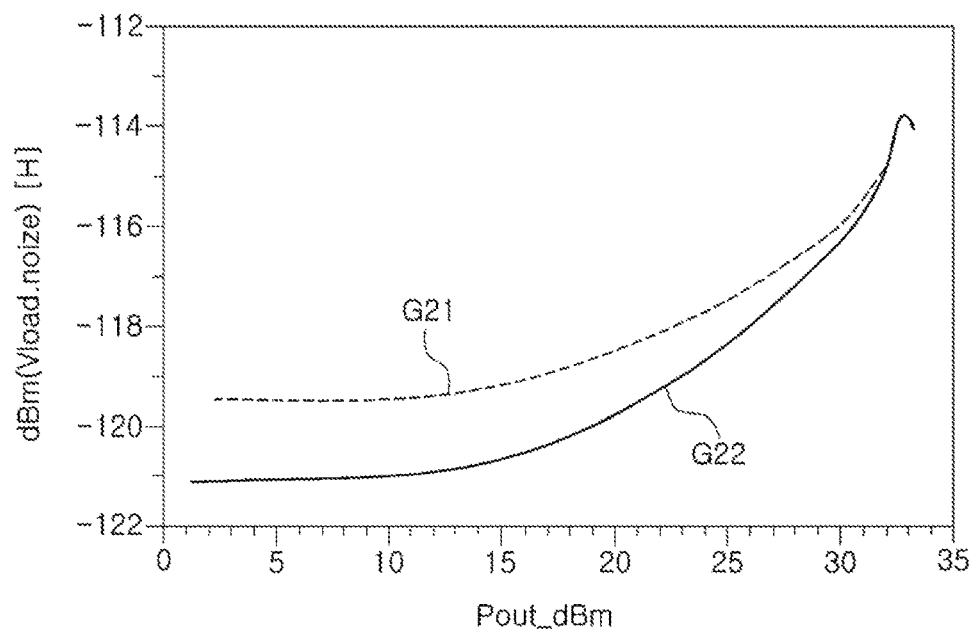
FIG. 11 is a graph illustrating an example of an output power-noise level characteristics for a receiving band.

FIG. 11 is a graph illustrating output power-noise level characteristics for a receiving band according to an example in the present disclosure.

In FIG. 11, G21 is a graph illustrating an output power-noise level for a case in which the impedance compensation is not performed at the time of changing the receiving band, and G22 is a graph illustrating the output power-noise level for a case in which the impedance compensation is performed at the time of changing the receiving band.

Referring to the G21 and G22 of FIG. 11, it may be seen that the output power-noise level according to the present disclosure performing the impedance compensation at the time of changing the receiving band is reduced as compared to a conventional case in which the impedance compensation is not performed at the time of changing the receiving band.

As long as the receiving band-rejection filter 230 is disposed on a signal path between the power amplifier PA of the power amplifying circuit 250 and the transmitting circuit 250, a disposed position thereof is not particularly limited.

In addition, as the receiving band-rejection filter 230, a filter having excellent selectivity or Q characteristics that may pass the transmitting band and remove the receiving band, for example, a surface acoustic wave (SAW) filter or a bulk acoustic wave (BAW) filter may be used.

Here, in the respective examples in the present disclosure, the receiving band-rejection filter 230 may be implemented as a variable filter, and as such a variable filter, a variable filter element or a switch-type variable circuit may be used, and a method for implementing the variable filter is not particularly limited.

According to an example as described above, a resonance frequency is matched to a center frequency of the receiving band by disposing a sharp receiving band-rejection filter of the resonance filter type on an input path of the power amplifier, whereby transmission insertion loss may be significantly reduced and the noise of the receiving band may be significantly suppressed.

As set forth above, according to the examples in the present disclosure, the multiband RF transceiver may efficiently remove the noise of the receiving band that is introduced into the radio frequency receiver from the multiband radio frequency transceiver, whereby low power loss may be maintained.

In addition, the sensitivity may be improved by effectively reducing the noise of the receiving band even in the case in which the receiving band is varied at a small area and low complexity, and when the noise of the receiving band is reduced, the load of the duplexer for the reception isolation may be decreased, whereby the transmission insertion loss of the duplexer may be improved and harmonic performance thereof may also be improved.

Furthermore, the impedance mismatch that deviates in response to the variation of the receiving band may be compensated, whereby the impedance mismatch loss may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multiband radio frequency transmitter of a transceiver in which a receiving band is varied, comprising:
    a transmitting circuit configured to generate a transmission signal and include a first matching circuit for impedance matching of an output terminal of the transmitting circuit;
    a receiving band-rejection filter configured to vary a rejection band in response to a variation of the receiving band, and reject the receiving band from the transmission signal provided from the transmitting circuit;
    a power amplifying circuit configured to amplify the transmission signal that passes through the receiving band-rejection filter and include a second matching circuit for impedance matching of an input terminal of the power amplifying circuit; and
    an impedance compensating circuit configured to compensate for impedance mismatch due to the variation of the rejection band of the receiving band-rejection filter.

2. The multiband radio frequency transmitter of claim 1, wherein the impedance compensating circuit comprises:
    a first impedance compensating circuit disposed between the transmitting circuit and the receiving band-rejection filer, and configured to compensate for mismatch of output impedance of the transmitting circuit in response to the variation of the rejection band of the receiving band-rejection filter; and
    a second impedance compensating circuit disposed between the receiving band-rejection filter and the power amplifying circuit, and configured to compensate for mismatch of input impedance of the power amplifying circuit in response to the variation of the rejection band of the receiving band-rejection filter.

3. The multiband radio frequency transmitter of claim 2, wherein the receiving band-rejection filter comprises:
    an inductor circuit inserted into a signal wiring between the transmitting circuit and the power amplifying circuit; and
    a capacitor circuit connected in parallel to the inductor circuit to perform a parallel resonance with inductance of the inductor circuit, and having capacitance varied in response to a first control signal to vary the rejection band in response to the variation of the receiving band.

4. The multiband radio frequency transmitter of claim 3, wherein the inductor circuit comprises a bonding wire.

5. The multiband radio frequency transmitter of claim 2, wherein the first impedance compensating circuit comprises a first variable capacitor circuit having capacitance varied in response to a second control signal to compensate for the mismatch of the output impedance of the transmitting circuit due to the variation of the rejection band of the receiving band-rejection filter.

6. The multiband radio frequency transmitter of claim 2, wherein the second impedance compensating circuit comprises a second variable capacitor circuit having capacitance varied in response to a third control signal to compensate for the mismatch of the input impedance of the power amplifying circuit due to the variation of the rejection band of the receiving band-rejection filter.

7. The multiband radio frequency transmitter of claim 2, wherein the receiving band-rejection filter comprises an inductor circuit and a capacitor circuit that are connected between a connection node between the transmitting circuit and the power amplifying circuit, and a ground, and configured to perform series resonance in the receiving band, and
    wherein the capacitor circuit has capacitance varied in response to a first control signal to vary the rejection band in response to the variation of the receiving band.

8. The multiband radio frequency transmitter of claim 2, wherein the receiving band-rejection filter comprises:
    an inductor circuit inserted into a signal wiring between the transmitting circuit and the power amplifying circuit; and
    a capacitor circuit connected in parallel to the inductor circuit to perform a parallel resonance with inductance of the inductor circuit, and having capacitance varied in response to a first control signal of the control circuit to vary the rejection band in response to the variation of the receiving band.

9. The multiband radio frequency transmitter of claim 8, wherein the inductor circuit comprises a bonding wire.

10. The multiband radio frequency transmitter of claim 1, wherein the variation of the receiving band is from a first frequency band to a second frequency band.

11. The multiband radio frequency transmitter of claim 10, wherein the first frequency band includes a range of 2110 to 2170 MHz and the second frequency band includes a range of 1930 to 1990 MHz.

12. The multiband radio frequency transmitter of claim 10, wherein the first frequency band includes a range of 2110 to 2170 MHz and the second frequency band includes a range of 1805 to 1880 MHz.

13. The multiband radio frequency transmitter of claim 10, wherein the first frequency band includes a range of 1930 to 1990 MHz and the second frequency band includes a range of 1805 to 1880 MHz.

14. A multiband radio frequency transmitter of a transceiver in which a receiving band is varied, comprising:

a transmitting circuit configured to generate a transmission signal and include a first matching circuit for impedance matching of an output terminal of the transmitting circuit;

a receiving band-rejection filter configured to vary a rejection band in response to a variation of the receiving band, and reject the receiving band from the transmission signal provided from the transmitting circuit;

a power amplifying circuit configured to amplify the transmission signal that passes through the receiving band-rejection filter and include a second matching circuit for impedance matching of an input terminal of the power amplifying circuit;

an impedance compensating circuit configured to compensate for impedance mismatch due to the variation of the rejection band of the receiving band-rejection filter; and a control circuit configured to control the variation of the rejection band of the receiving band-rejection filter and a variation of impedance of the impedance compensating circuit at the time of varying the receiving band.

15. The multiband radio frequency transmitter of claim 14, wherein the impedance compensating circuit comprises:
a first impedance compensating circuit disposed between the transmitting circuit and the receiving band-rejection filer, and configured to compensate for mismatch of output impedance of the transmitting circuit in response to the variation of the rejection band of the receiving band-rejection filter; and a second impedance compensating circuit disposed between the receiving band-rejection filter and the power amplifying circuit, and configured to compensate for mismatch of input impedance of the power amplifying circuit in response to the variation of the rejection band of the receiving band-rejection filter.

16. The multiband radio frequency transmitter of claim 15, wherein the first impedance compensating circuit comprises a first variable capacitor circuit having capacitance varied in response to a second control signal to compensate for the mismatch of the output impedance of the transmitting circuit due to the variation of the rejection band of the receiving band-rejection filter.

17. The multiband radio frequency transmitter of claim 15, wherein the second impedance compensating circuit comprises a second variable capacitor circuit varying capacitance varied in response to a third control signal of the control circuit to compensate for the mismatch of the input impedance of the power amplifying circuit in response to the variation of the rejection band of the receiving band-rejection filter.

18. The multiband radio frequency transmitter of claim 15, wherein the receiving band-rejection filter comprises an inductor circuit and a capacitor circuit that are connected between a connection node between the transmitting circuit and the power amplifying circuit, and a ground, and configured to perform series resonance in the receiving band, and wherein the capacitor circuit has capacitance varied in response to a first control signal of the control circuit to vary the rejection band in response to the variation of the receiving band.

19. The multiband radio frequency transmitter of claim 15, wherein the receiving band-rejection filter is implemented in an integrated circuit together with the control circuit.

20. The multiband radio frequency transmitter of claim 14, wherein the variation of the receiving band is from a first frequency band to a second frequency band.

* * * * *